United States Patent [19]
Lee et al.

[11] Patent Number: 5,343,354
[45] Date of Patent: Aug. 30, 1994

[54] STACKED TRENCH CAPACITOR AND A METHOD FOR MAKING THE SAME

[75] Inventors: Tae-woo Lee, Seoul; Seon-jun Kim, Kyungki; Yang-ku Lee, Seoul, all of Rep. of Korea

[73] Assignee: Samsung ELectronics Co., Ltd., Kyungki, Rep. of Korea

[21] Appl. No.: 74,892

[22] Filed: Jun. 11, 1993

[30] Foreign Application Priority Data

Jun. 11, 1992 [KR] Rep. of Korea .............. 92 10158

[51] Int. Cl.$^5$ .............................................. H01G 4/10
[52] U.S. Cl. ........................... 361/322; 361/311; 257/303; 257/304; 257/305; 437/60
[58] Field of Search ............ 361/311, 312, 313, 321.1, 361/322, 303; 437/47, 52, 60, 61; 257/296, 297, 300, 301, 303, 304, 305, 311

[56] References Cited

U.S. PATENT DOCUMENTS

| | | | |
|---|---|---|---|
| 4,551,743 | 11/1985 | Murakami | 257/513 |
| 4,740,480 | 4/1988 | Ooka | 437/61 |
| 5,017,981 | 5/1991 | Sunami et al. | 257/301 |
| 5,066,608 | 11/1991 | Kim et al. | 437/52 |
| 5,223,730 | 6/1993 | Rhoades et al. | 257/304 |
| 5,252,517 | 10/1993 | Blalock et al. | 437/195 |

FOREIGN PATENT DOCUMENTS

| | | | |
|---|---|---|---|
| 0113460 | 6/1985 | Japan | 257/305 |
| 0261168 | 12/1985 | Japan | 257/304 |

*Primary Examiner*—Bruce A. Reynolds
*Assistant Examiner*—Gregory L. Mills
*Attorney, Agent, or Firm*—Robert A. Westerlund; Stephen R. Whitt; Charles R. Donohoe

[57] ABSTRACT

A stacked trench capacitor including a first trench formed in a semiconductor substrate, an insulating material, preferably BPSG, substantially filling the first trench to thereby define an isolation region of the substrate, a second trench formed in the first trench, the second trench being much narrower and shallower than the first trench, a storage electrode formed on the sidewalls and bottom surface of the second trench, a thin dielectric film formed on the storage electrode, and a plate electrode formed on the thin dielectric film. In a preferred embodiment, the isolation region serves to separate and electrically isolate adjacent memory cells of a semiconductor memory device, each of the memory cells including a MOSFET transistor and a stacked trench capacitor constructed as described above. An impurity region is formed in the substrate adjacent an outer sidewall of the second trench to a depth preferably substantially equal to that of the second trench, the conductivity type of the impurity region being opposite that of the substrate. An upper portion of the impurity region preferably serves as the source region of the MOSFET transistor of the memory cell.

20 Claims, 4 Drawing Sheets

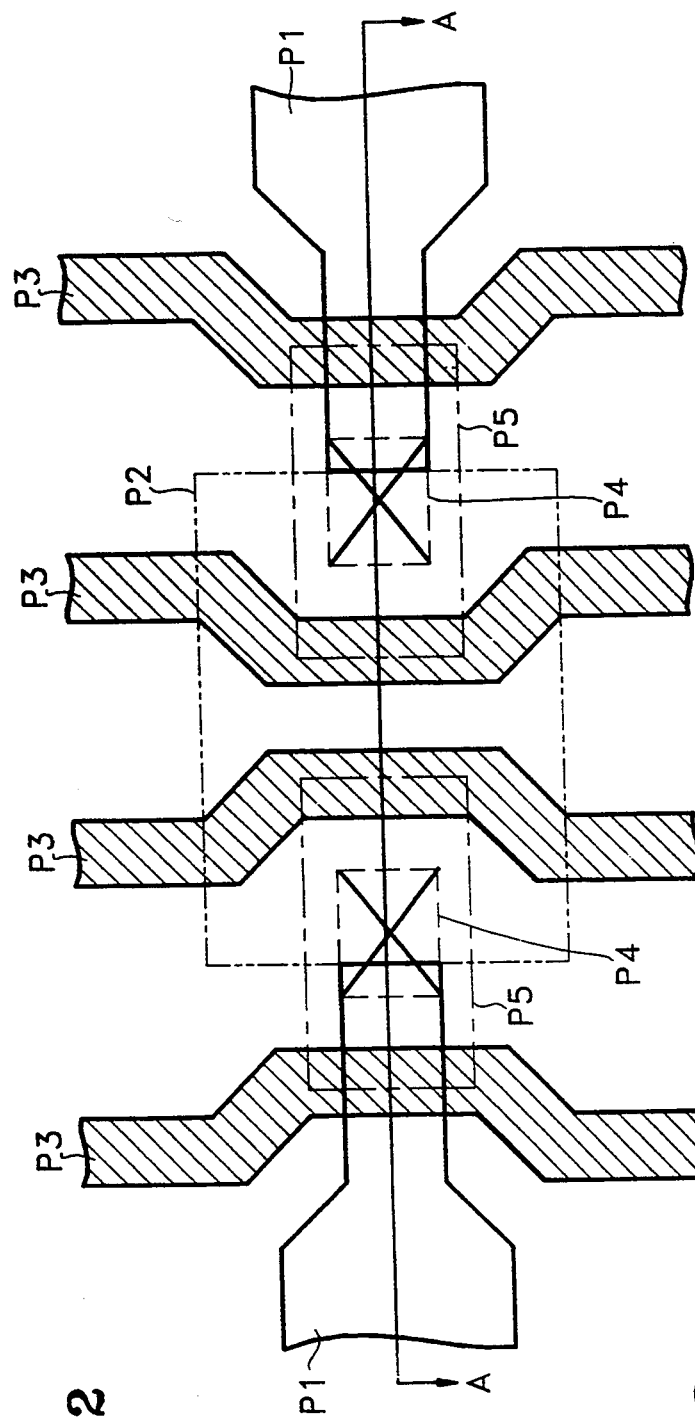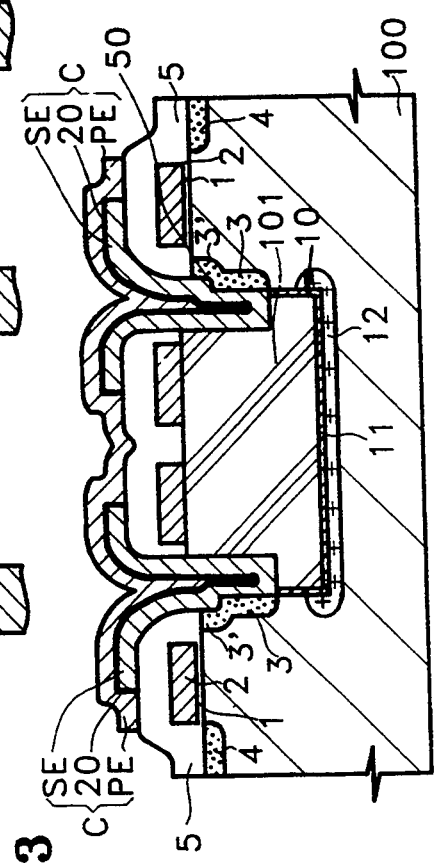
FIG. 2
FIG. 3

STACKED TRENCH CAPACITOR AND A METHOD FOR MAKING THE SAME

BACKGROUND OF THE INVENTION

The present invention relates generally to semiconductor memory devices and methods for making the same, and more particularly, to a novel stacked trench capacitor especially suitable for semiconductor memory devices having increased cell packing density, and a method for making the same.

It is generally well-known that significant advancements have been made in recent years with respect to increasing the cell packing density or integration level of semiconductor memory devices, such as dynamic random access memories (DRAMs). As a general rule, the memory capacity of DRAMs has been quadrupled approximately every three years. At the present time, 4 Mb DRAMs are in mass production, 16 Mb DRAMs are about to enter into mass production, 64 Mb DRAMs are in a later stage of development, and 256 Mb DRAMs are in an earlier stage of development.

In general, the chip surface area of semiconductor memory devices is increased by approximately 1.4X for each 4X increase in cell packing density thereof, which results in an approximately ½ reduction in the surface area available for each memory cell. Therefore, for each new generation of semiconductor memories, it has become necessary to increase the capacitance to surface area ratio of each memory cell in order to achieve sufficiently large memory cell capacitance. Past techniques for achieving this can be broadly classified into the following three categories:

(1) decreasing the thickness of the dielectric film of the memory cell capacitors;

(2) increasing the dielectric constant of the dielectric film; and, (3) increasing the effective area of the storage electrode of the memory cell capacitors.

With respect to the first technique enumerated above, the lower practical limit of dielectric film thickness is approximately 100 Å, because the reliability of the memory cells becomes unacceptably degraded when the thickness of the dielectric film is less than 100 Å, due to the creation of Fowler-Nordheim currents. With respect to the second technique enumerated above, the most promising high dielectric constant dielectric film material is tantalum pentoxide ($Ta_2O_5$), which provides good coverage with respect to three-dimensional memory cell structures having a high aspect ratio. However, tantalum pentoxide exhibits a high leakage current and a low breakdown voltage in a thin film state, thus limiting its utility with respect to the ultra-high capacity memories currently under development.

Consequently, the bulk of the current development efforts have been focused on the third technique enumerated above, namely, increasing the effective area of the storage electrode of the memory cell capacitors. Historically, as the need for memory cells having a large capacitance to surface area ratio has increased in parallel with the continuing development of memories having increased cell packing densities, the structure of memory cell capacitors has evolved from planar-type capacitors to three dimensional stack-type and trench-type capacitors, culminating at the present time in a stacked trench-type capacitor which is a hybrid of the stack-type and trench-type capacitors.

Since the stacked trench-type capacitor constitutes the current state-of-the-art in the field of memory cell capacitors, a pair of adjacent memory cells each including a capacitor of this type are depicted in FIG. 1, and will now be described with reference thereto. More particularly, each of the two memory cells depicted in FIG. 1 includes a transistor and a stacked trench capacitor, with the adjacent memory cells being separated by an isolation region of a P-type semiconductor substrate 100. As can be readily seen, the transistor of each memory cell is comprised of a drain region (only partially shown), a source region 3', and a gate electrode 2 separated from the upper surface of the semiconductor substrate 100 by a thin gate oxide layer 1, and spanning the separation between the source and drain regions, which defines the channel region of the transistor. The source and drain regions are formed in the upper surface of the semiconductor substrate 100 and define an active region of the semiconductor substrate 100. A field oxide layer 102 formed in the upper surface of the semiconductor substrate 100 between the adjacent memory cells defines the isolation region of the semiconductor substrate 100. An insulating layer 5 is formed on the gate electrode 2 of each memory cell and over the active and isolation regions of the semiconductor substrate 100.

Each memory cell further includes a stacked trench capacitor C constructed as follows. A trench 30 is formed in the upper surface of the semiconductor substrate 100 so as to extend to a predetermined depth below the upper surface of the semiconductor substrate 100. An N+doped region 3 is formed in the surface portion of the semiconductor substrate 100 defining the trench 30 of each memory cell capacitor C, so that the doped region 3 extends along the interior surface of the trench 30 from the source region 3' of the transistor to the field oxide layer 102 between the adjacent memory cells. Next, a storage electrode SE is formed on the bottom surface and sidewalls of the trench 30 of each capacitor C, and on the insulating layer 5 of each transistor, to thereby provide a generally U-shaped storage electrode SE in contact with the N+doped region 3. Then, a thin dielectric film 20 is formed on the entire outer surface of the storage electrode SE of each capacitor C. Finally, a plate electrode PE is formed on the thin dielectric film 20 of each capacitor C, and on the insulating layer 5 of each transistor, to thereby complete the stacked trench capacitor structure.

In the above-described semiconductor memory device utilizing conventional stacked trench type memory cell capacitors, if the length S of the isolation region between adjacent memory cells is shortened, the distance between the adjacent trenches 30 is commensurately reduced, thereby increasing the leakage current between adjacent memory cells and degrading the isolation characteristics of the overall semiconductor memory device. Further, the formation of the trenches 30 is achieved by etching, which can cause damage to the surface of the semiconductor substrate 100. Additionally, the N+doped regions 3 are disadvantageously wide, thereby unduly increasing the leakage current from the capacitors C to the semiconductor substrate 100, which ultimately degrades the performance and reliability of the overall semiconductor memory device.

Based upon the above and foregoing, it can be appreciated that there presently exists a need in the semiconductor memory art for a semiconductor memory device which eliminates the above-described drawbacks and shortcomings of the presently available semiconductor memory devices. The present invention fulfills this need.

SUMMARY OF THE INVENTION

The present invention encompasses a stacked trench capacitor including a first trench formed in a semiconductor substrate, an insulating material, preferably BPSG, substantially filling the first trench to thereby define an isolation region of the substrate, a second trench formed in the first trench, the second trench being much narrower and shallower than the first trench, a storage electrode formed on the sidewalls and bottom surface of the second trench, a thin dielectric film formed on the storage electrode, and a plate electrode formed on the thin dielectric film. In a preferred embodiment, the isolation region serves to separate and electrically isolate adjacent memory cells of a semiconductor memory device, each of the memory cells including a MOSFET transistor and a stacked trench capacitor constructed as described above. An impurity region is formed in the substrate adjacent an outer sidewall of the second trench to a depth preferably substantially equal to that of the second trench, the conductivity type of the impurity region being opposite that of the substrate. An upper portion of the impurity region preferably serves as the source region of the MOSFET transistor of the memory cell.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 2 is a plan view of the mask lay-out for a pair of adjacent memory cells of a semiconductor memory device incorporating the novel stacked trench capacitor of the present invention;

FIG. 3 is a partial, cross-sectional view of a semiconductor memory device illustrating the structure of the novel stacked trench capacitor of the present invention; and, FIGS. 4A–4E depict successive steps for manufacturing the structure depicted in FIG. 3, thereby illustrating the method for making the novel stacked trench capacitor of the present invention.

DETAILED DESCRIPTION OF THE INVENTION

Figure 1:
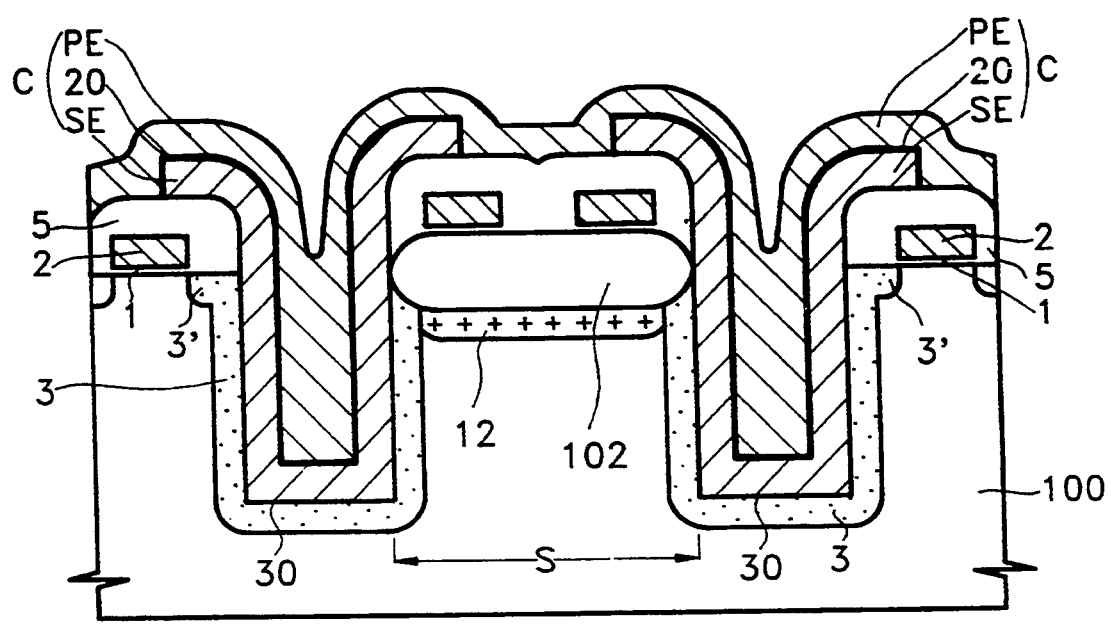
FIG. 1 is a partial, cross-sectional view of a conventional semiconductor memory device, showing the structure of the stacked trench capacitor and transistor of two adjacent memory cells and the isolation region therebetween.

With reference now to FIG. 2, there can be seen a plan view of the mask lay-out for a pair of adjacent memory cells of a semiconductor memory device constructed in accordance with a preferred embodiment of the present invention. Reference character P1 designates mask patterns for forming an active region of a semiconductor substrate, in each memory cell. Reference character P2 designates a mask pattern for forming an isolation region of the semiconductor substrate. Reference character P3 designates mask patterns for forming a gate electrode of the transistor of each memory cell and the word lines formed over the isolation region. Reference character P4 designates mask patterns for forming a contact hole for facilitating electrical connection between the source of the transistor and the storage electrode of the capacitor of each memory cell. Reference character P5 designates mask patterns for forming the storage electrode of the capacitor of each memory cell.

With reference now to FIG. 3, a semiconductor memory device constructed in accordance with a preferred embodiment of the present invention will now be described. More particularly, FIG. 3 is a sectional view of two adjacent memory cells of the semiconductor memory device. By way of overview, each of the memory cells is comprised of a transistor and a capacitor, with the transistors being formed in active regions of a P-type semiconductor substrate 100, and the memory cells being separated from each other by an isolation region of the semiconductor substrate 100.

Each of the memory cells is constructed as follows. A first trench 10 having a predetermined depth is formed in the semiconductor substrate 100. An oxide layer 11 is formed on the inner sidewalls and bottom surface of the first trench 10, and a channel stop layer 12 is formed in the substrate 100 beneath the bottom surface of the first trench 10, e.g., by means of an ion-implantation process. The first trench 10 is filled with an insulating material, e.g., a field oxide layer, to thereby define an isolation region 101 in the upper surface of the semiconductor substrate 100, the isolation region 101 serving to electrically isolate the memory cells disposed on opposite sides thereof, in the normal manner.

A pair of second trenches 50, each of which is narrower and shallower than the first trench 10, are formed in the isolation region 101 of the substrate 100, on opposite sides thereof. The transistor of each of the memory cells is comprised of a drain region 4, a source region 3', and a gate electrode 2 separated from the upper surface of the semiconductor substrate 100 by a thin gate oxide layer 1, and spanning the separation between the source and drain regions, which defines the channel region of the transistor. The source and drain regions, 3', 4, respectively, are formed in the upper surface of the semiconductor substrate 100 and define an active region of the semiconductor substrate 100. N+doped regions 3 are formed on the outer sidewall of each of the second trenches 50 in contact with the substrate 100, and preferably extend to a depth substantially equal to the depth of the second trenches 50, which is less than the predetermined depth of the first trench 10. An insulating layer 5 is formed on the gate electrode 2 of each memory cell and over the active and isolation regions of the substrate 100.

The capacitor C of each of the memory cells is comprised of a storage electrode SE, a thin dielectric film 20, and a plate electrode PE. The storage electrode SE of each capacitor C is formed on the bottom surface and sidewalls of the corresponding one of the second trenches 50 and on the insulating layer 5 of the corresponding transistor. The thin dielectric film 20 is formed on the entire outer surface of the storage electrode SE of each capacitor C. The plate electrode PE of each capacitor C is formed on the thin dielectric film 20 and insulating layer 5 of the corresponding memory cell, to thereby complete the novel stacked trench capacitor structure of the preferred embodiment of the present invention.

With reference now to FIGS. 4A–4E, the process for making the above-described semiconductor memory device in accordance with the present invention will now be described. It should be appreciated that although the process of the present invention will be described with sole reference to the structure shown in FIGS. 4A–4E, which corresponds to two adjacent memory cells and the isolation region therebetween, the overall semiconductor memory device includes a matrix of memory cells of like construction.

Figure 4A:
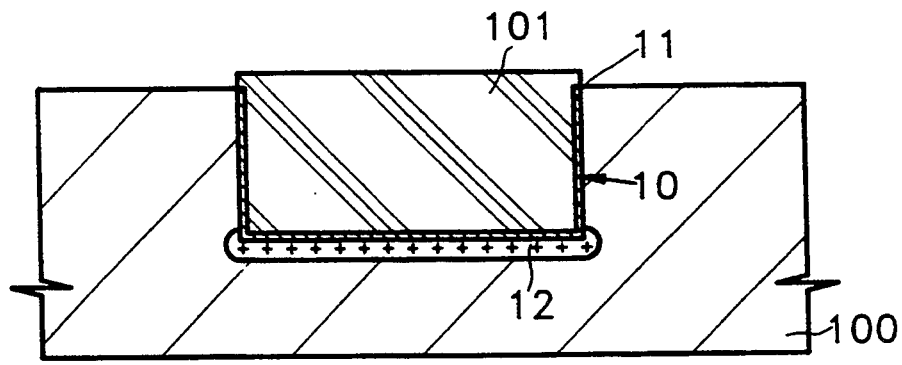

With particular reference now to FIG. 4A, the first step of the process is to define the active and isolation regions in the semiconductor substrate 100, which is of a first conductivity type, e.g., P-type. More particularly, the region of the semiconductor substrate 100 which will be disposed between the adjacent memory cells of the finished device is etched to a predetermined depth, e.g., approximately 6,000 Å–1μ, to thereby form the first trench 10 depicted in FIG. 4A. Next, a thin insulating layer 11, e.g., an oxide layer having a thickness of approximately 300 Å, is formed on the sidewalls and bottom surface of the first trench 10, preferably by means of a dry oxidation process. Then, impurities of the same conductivity type as that of the substrate 100 are ion-implanted beneath the bottom surface of the first trench 10, to thereby provide a channel-stop layer 12. Next, an insulating material, preferably boro-phosphosilicate glass (BPSG), is deposited on the oxide layer 11 so as to fill up the first trench 10, to thereby provide the isolation region 101. Preferably, the BPSG material is deposited to a thickness of approximately 9,000 Å and then etched-back so as to planarize the upper surface thereof. Although the isolation region 101 is illustrated in FIGS. 4A–4E as projecting slightly above the upper surface of the semiconductor substrate 100, this is not limiting to the invention. For example, the isolation region 101 may suitably be leveled off with the upper surface of the substrate 100 during the etch-back process. BPSG is the preferred insulating material for the isolation region 101 because of its excellent electrical insulating and isolation characteristics. By using BPSG in place of the prior art field oxide layer, the distance between adjacent memory cells can be reduced to approximately 0.2μ without degrading the isolation between adjacent memory cells, thereby enabling a significant increase in the integration density of the semiconductor memory device relative to presently available semiconductor memory devices. Moreover, BPSG exhibits excellent etch selectivity (approximately 40:1) with respect to silicon (the substrate material), thereby mitigating the damage incurred by the semiconductor substrate 100 during the subsequently described etching steps for forming the second trenches 50 on opposite sides of the isolation region 101. Thus, leakage current caused by damage to the substrate 100 can be minimized by utilizing BPSG for the isolation region 101.

Figure 4B:
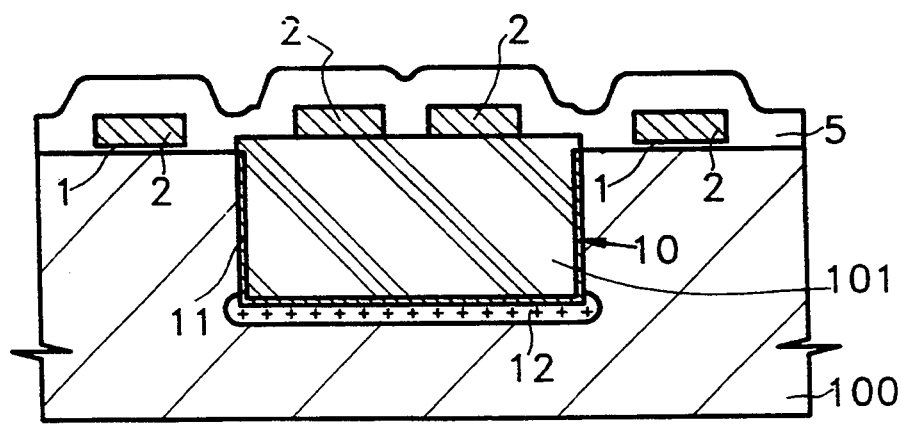

With reference now to FIG. 4B, the next step is to form a thin gate insulating layer 1, e.g., an oxide layer, on the upper surface of the semiconductor substrate 100 on opposite sides of the isolation region 101. Next, metal electrodes 2 are formed on the upper surface of the isolation region 101 in spaced-apart relationship to each other. Also, a metal electrode 2 is formed on the gate insulating layer 1 on opposite sides of the isolation region 101. The metal electrodes 2 formed on the upper surface of the isolation region 101 constitute word lines for the memory device, and the metal electrodes 2 formed on the gate insulating layer 1 constitute the gate electrodes of the MOSFET transistors of the adjacent memory cells disposed on opposite sides of the isolation region 101. Thereafter, an insulating layer 5 is formed over the entire resultant structure. The insulating layer 5 is preferably a high-temperature oxide layer deposited to a thickness of approximately 1,300 Å by means of a low-temperature chemical vapor deposition (LPCVD) process.

Figure 4C:
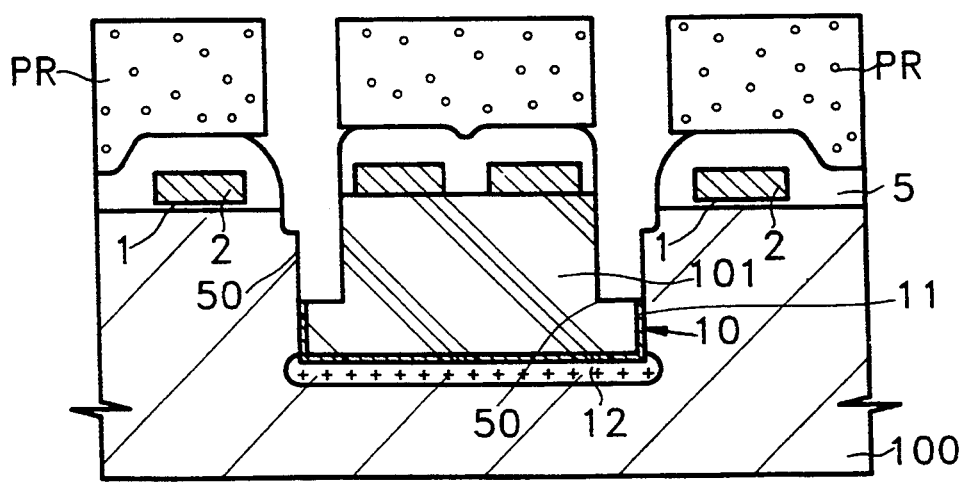

With reference now to FIG. 4C, the next step is to form a second trench 50 in opposite sides of the isolation region 101. More particularly, a photoresist material is deposited on the entire upper surface of the insulating layer 5 and then patterned to provide the photoresist pattern PR shown in FIG. 4C. Thereafter, using the photoresist pattern PR as a mask, portions of the isolation region 101 underlying the openings in the photoresist pattern PR are etched away in such a manner as to form second trenches 50 which are substantially narrower and shallower than the first trench 10. In a preferred embodiment of the present invention, the depth of the second trenches 50 is approximately 6,000 Å and the width is approximately 0.7 μ, although these dimensions are not limiting to the present invention. Because of the high etching selectivity ratio of the BPSG material of the isolation region 101 with respect to the silicon material of the semiconductor substrate 100, damage to the substrate 100 which may occur during the etching process for forming the second trenches 50 is minimized.

Figure 4D:
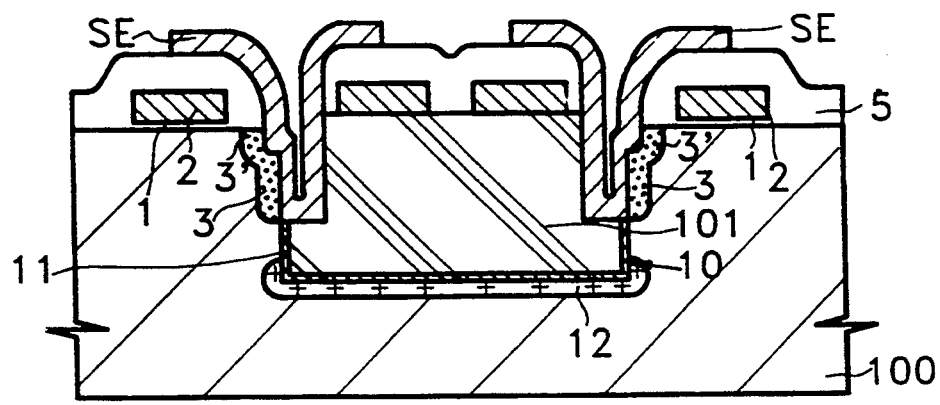

With reference now to FIG. 4D, the next step is to remove the photoresist pattern PR. Thereafter, polycrystalline silicon (polysilicon) is deposited on the entire upper surface of the resultant structure, and then patterned (by etching) in such a manner as to form a storage electrode SE on the bottom surface and sidewalls of each of the second trenches 50, and on the adjacent sidewall and a portion of the upper surface of opposite, adjacent portions of the insulating layer 5. In order to render the polysilicon material of the storage electrodes SE highly conductive, impurities of a second conductivity type (i.e., N-type impurities when a P-type substrate is utilized) are ion implanted in the entire surface of the polysilicon material comprising the storage electrodes SE. Then, the impurities are diffused by means of a thermal process to thereby form an impurity region 3 of the second conductivity type (e.g., N+) in the substrate 100 in contact with the outer sidewall of each of the second trenches 50, and extending to a depth substantially equal to the depth of the second trenches 50, which is less than the depth of the first trench 10.

The upper portion of each impurity (N+doped) region 3 comprises the source region 3' of the MOSFET transistor of a respective one of the adjacent memory cells separated by the isolation region 101. The drain region 4 of the MOSFET transistor of each of the adjacent memory cells is conveniently formed in the upper surface of the semiconductor substrate 100 at some later point in the manufacturing process, in the normal manner, e.g., when the bit lines (not shown) for the memory device are formed.

With the present invention, the impurity region 3 is formed along only one (the outer) sidewall of the second trench 50 in which the stacked trench capacitor of the memory cell is formed, thereby reducing the area of the impurity region 3 in electrical contact with the capacitor by approximately 66% relative to the conventional stacked trench capacitor depicted in FIG. 1, wherein the impurity region 3 is formed to surround the trench 30 in which the capacitor is formed. Hence, the leakage current from the capacitor to the substrate is significantly reduced with the present invention.

Figure 4E:
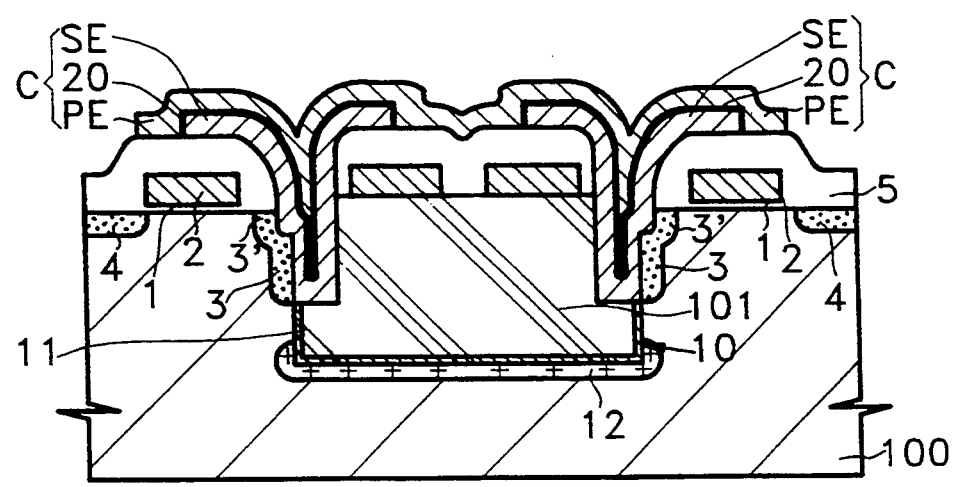

With reference now to FIG. 4E, the remaining steps for forming the capacitor C of each of the adjacent memory cells. More particularly, a thin dielectric film 20 is deposited on the entire upper surface of the storage electrode SE of the capacitor C of each memory cell. Next, a conductive material, e.g., an impurity-doped polysilicon material, is deposited on the entire upper surface of the thin dielectric film 20 of each capacitor C and adjacent portions of the insulating layer 5, to thereby form the plate electrode PE of the capacitor C of each memory cell and thus complete the novel stacked trench capacitor structure of the preferred embodiment of the present invention.

Although the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A stacked trench capacitor, comprising:
   a first trench having a first depth and a first width formed in a semiconductor substrate, said first trench having a bottom surface and sidewalls;
   an isolation insulating layer substantially filling said first trench and defining an isolation region of said substrate;
   a second trench having a second depth and a second width formed in said first trench, said second trench having inner and outer sidewalls and a bottom surface, said outer sidewall being in contact with said substrate, and said second depth being less than said first depth and said second width being less than said first width;
   a storage electrode formed on said inner and outer sidewalls and bottom surface of said second trench;
   a thin dielectric film formed on said storage electrode; and,
   a plate electrode formed on said thin dielectric film.

2. The capacitor as set forth in claim 1, wherein said isolation insulating layer is comprised of borophosphosilicate glass (BPSG).

3. The capacitor as set forth in claim 1, further comprising an oxide layer interposed between said isolation insulating layer and said bottom surface of said first trench.

4. The capacitor as set forth in claim 3, further comprising a channel stop layer formed beneath said bottom surface of said first trench, said channel stop layer being comprised of a high concentration of impurities of a conductivity type the same as that of said substrate.

5. The capacitor as set forth in claim 4, further comprising an impurity region formed in said substrate in contact with said storage electrode, said impurity region being comprised of impurities of an opposite conductivity type as that of said substrate.

6. The capacitor as set forth in claim 5, wherein an upper portion of said impurity region comprises a source region of a MOSFET transistor of a memory cell of a semiconductor memory device.

7. The capacitor as set forth in claim 6, wherein said impurity region has a depth substantially equal to said second depth.

8. The capacitor as set forth in claim 7, wherein said isolation insulating layer is comprised of BPSG.

9. The capacitor as set forth in claim 7, wherein said isolation region serves to separate and electrically isolate adjacent memory cells of said semiconductor memory device.

10. The capacitor as set forth in claim 9, wherein said second width is less than on-third of said first width.

11. The capacitor as set forth in claim 6, wherein said MOSFET transistor includes:
    said source region;
    a drain region formed in said semiconductor substrate and separated from said source region by a distance defining the length of the channel region of said MOSFET transistor, said drain region being of a conductivity type the same as that of said source region;
    a thin gate insulation film formed on an upper surface of said semiconductor substrate;
    a gate electrode formed on said thin gate insulation film and substantially spanning said channel region;
    an upper insulating layer formed on said gate electrode and said upper surface of said semiconductor substrate; and,
    wherein further, said capacitor and said MOSFET transistor together comprise said memory cell of said semiconductor memory device.

12. The capacitor as set forth in claim 11, wherein:
    said storage electrode includes opposed legs and a bottom surface interconnecting said opposed legs, a substantial portion of said opposed legs extending upwardly beyond said upper surface of said semiconductor substrate and outwardly in opposite directions;
    said substantial portion of said opposed legs of said storage electrode being disposed on adjacent portions of said upper insulating layer; and,
    said plate electrode includes an outer flank portion which extends beyond an outer peripheral edge of said storage electrode and is disposed on said upper insulating layer proximate to said adjacent portions of said upper insulating layer.

13. A method for making a stacked trench capacitor, comprising the steps of:
    forming a first trench having a first depth and a first width in a semiconductor substrate, said first trench having a bottom surface and sidewalls;
    substantially filling said first trench with an isolation insulating layer, to thereby define an isolation region of said substrate;
    forming a second trench having a second depth and a second width in said first trench, said second trench being formed to have inner and outer sidewalls and a bottom surface, said outer sidewall being in contact with said substrate, and said second depth being less than said first depth and said second width being less than said first width;
    forming a storage electrode on said inner and outer sidewalls and bottom surface of said second trench;
    forming a thin dielectric film on said storage electrode; and,
    forming a plate electrode on said thin dielectric film.

14. The method as set forth in claim 13, wherein said isolation insulating layer is comprised of BPSG.

15. The method as set forth in claim 14, further comprising, prior to performing said forming a storage electrode step, the step of ion-implanting and thermally diffusing impurities of a conductivity type opposite that of said substrate into said substrate adjacent said outer sidewall of said second trench, to thereby form an impurity region in contact with said storage electrode.

16. The method as set forth in claim 15, wherein said impurity region has a depth substantially equal to said second depth.

17. The method as set forth in claim 15, wherein an upper portion of said impurity region comprises a source region of a MOSFET transistor of a memory cell of a semiconductor memory device.

18. The method as set forth in claim 17, wherein said MOSFET transistor includes:
- said source region;
- a drain region formed in said semiconductor substrate and separated from said source region by a distance defining the length of the channel region of said MOSFET transistor, said drain region having a conductivity type the same as that of said source region;
- a thin gate insulation film formed on an upper surface of said semiconductor substrate;
- a gate electrode formed on said thin gate insulation film and substantially spanning said channel region;
- an upper insulating layer formed on said gate electrode and said upper surface of said semiconductor substrate; and, wherein further, said capacitor and said MOSFET transistor together comprise said memory cell of said semiconductor memory device.

19. The method as set forth in claim 18, wherein said isolation region serves to separate and electrically isolate adjacent memory cells of said semiconductor memory device.

20. The method as set forth in claim 19, wherein:
- said storage electrode includes opposed legs and a bottom surface interconnecting said opposed legs, a substantial portion of said opposed legs extending upwardly beyond said upper surface of said semiconductor substrate and outwardly in opposite directions;
- said substantial portion of said opposed legs of said storage electrode being disposed on adjacent portions of said upper insulating layer; and,
- said plate electrode includes an outer flank portion which extends beyond an outer peripheral edge of said storage electrode and is disposed on said upper insulating layer proximate to said adjacent portions of said upper insulating layer.

* * * * *